United States Patent [19]

Hsu et al.

[11] Patent Number: 5,966,339
[45] Date of Patent: Oct. 12, 1999

[54] PROGRAMMABLE/REPROGRAMMABLE FUSE

[75] Inventors: Louis L. C. Hsu, Fishkill; Kenneth C. Arndt, Poughkeepsie; Jack A. Mandelman, Stormville, all of N.Y.

[73] Assignee: International Business Machines Corporation, Armonk, N.Y.

[21] Appl. No.: 09/088,889

[22] Filed: Jun. 2, 1998

[51] Int. Cl.$^6$ ........................................ G11C 7/00
[52] U.S. Cl. .................. 365/225.7; 365/200; 365/201
[58] Field of Search .................. 365/225.7, 200, 365/201, 189.07

[56] References Cited

U.S. PATENT DOCUMENTS

| | | | |
|---|---|---|---|
| 4,389,715 | 6/1983 | Eaton, Jr. et al. | 365/200 |
| 4,747,080 | 5/1988 | Yamada | 365/200 |
| 5,200,652 | 4/1993 | Lee | 307/465 |
| 5,412,593 | 5/1995 | Magel et al. | 365/96 |
| 5,432,388 | 7/1995 | Crafts et al. | 326/40 |
| 5,555,212 | 9/1996 | Toshiaki et al. | 365/200 |
| 5,642,316 | 6/1997 | Tran et al. | 365/200 |

*Primary Examiner*—David Nelms
*Assistant Examiner*—David Lam
*Attorney, Agent, or Firm*—H. Daniel Schnurmann

[57] ABSTRACT

A programmable/reprogrammable fuse arrangement that includes two fuse links provided each with an output port and an exclusive-or gate connected to the output port of each of the two fuses, wherein the fuse arrangement is reprogrammed by successively blowing both of the two fuse links is described. The programmable/reprogrammable fuse arrangement can be extended to a plurality of fuses and cascaded exclusive-ORs such that each fuse link provides one leg of the gate and the previous stage, the second. Thus, for N fuse links and N exclusive-ORs, the fuse arrangement thus formed can be reprogrammed a total of N times by sequentially blowing one fuse link at a time. The arrangement ceases to be reprogrammable once all the fuse links have been blown. The reprogrammable fuse arrangement is of particular importance for semiconductor memories and microprocessors, as for instance, for bringing in-line redundancy units attached to a fuse link.

23 Claims, 8 Drawing Sheets

TIMING DIAGRAM OF CIRCUIT ACTIVATION

PROGRAMMABLE/REPROGRAMMABLE FUSE

FIELD OF THE INVENTION

This invention relates to the field of semiconductor fuse devices, and more particularly, to a programmable/reprogrammable fuse circuit consisting of a combination of fuse links and exclusive-OR gates.

BACKGROUND OF THE INVENTION

Semiconductor and, more specifically, polysilicon or metal fuses are well known in the art and are commonly used, e.g., to activate redundancy configurations in memory devices such as SRAMs and DRAMs, or to trim resistors for setting reference levels in analog applications. Polysilicon or metal fuses are typically programmed by applying a high current pulse causing the fuse to melt and form an open circuit, or blown by a focused laser beam, both of which disable unwanted circuits or components.

Generally, fuses that are used in SRAMs and those that are used in DRAMs and microprocessors differ from each other primarily because the process of the one is not compatible with that of the other. More specifically, DRAMs and microprocessors typically use a CMOS process, wherein each additional process step, e.g., using double-polysilicon gate to form a floating gate, interpolysilicon oxide and tunnel oxide to allow for programming and erasure, requires extra materials and/or components which, in turn, introduces undesired cost overruns.

More recently, anti-fuses have been advanced having a thin dielectric layer placed between two layers of conductive material. Typically, anti-fuses start out as an open circuit and are programmed by applying a large voltage pulse which causes the dielectric to rupture, creating a conductive path. Fuses and anti-fuses have been used in a variety of combinations. An example of a combination of a reprogrammable link comprising fuses and anti-fuses used in an integrated circuit (IC) is described in U.S. Pat. No. 5,412,593 to Magel et al.

In another instance, in U.S. Pat. No. 5,200,652 issued to Lee, is described a programmable/reprogrammable structure which combines fuses and anti-fuses in a series/parallel arrangement, enabling multi-programming selected nodes within a circuit.

The presence of fuses and antifuses side by side, as described by Magel et al. and Lee typically requires a combination of selected materials and process steps which render the reprogrammable fuse far too expensive for many applications.

On an unrelated matter, conventional fuses can be programmed only once. Yet, reusing fuses is oftentimes important as, for instance, to alter the code in a Read-Only Memory (ROM) or a Programmable Read-Only Memory (PROM). In order to reprogram a fuse, several schemes have been suggested. However, they have the disadvantage of requiring the presence of certain fuse components which are not part of the traditional fuse technology, making them impractical for many applications. Specific examples described hereinafter will illustrate some of these drawbacks.

In a first illustration, programmable fuses are used in Programmable Logic Arrays (PLAs) to implement a first Boolean function, and then re-programmed to implement a second Boolean function. Programming is accomplished by blowing appropriate fuses in a fuse bank, disconnecting certain portions of the logic while letting other fuses provide the necessary connecting paths to form the desired circuit. An example of a PLA is described in U.S. Pat. No. 5,432,388 issued to Crafts et al. on Jul. 11, 1995.

In a second example, fuses have been used for programming Erasable Programmable Read-Only Memory devices (EPROM), even though EPROM fuses are known to be a one-time programmable element. Still, in another type of EPROM, known as an Electrically Erasable Programmable Read-Only Memory (EEPROM), reprogrammable EEPROM fuses have been successfully used to bring into operation redundancy circuits. Such an application is described in U.S. Pat. No. 5,642,316 to Tran et al. However, these devices suffer from a drawback in that they require a high voltage to program and erase. Moreover, such devices are incompatible with conventional CMOS processes, since the inherent nature of the materials commonly used for EEPROM fuses is not adaptable to conventional CMOS technology, thereby rendering them unfit for the above described applications.

In conclusion, in all aforementioned conventional programmable fuses, including EEPROMs, a fuse is programmed in order to define a logic configuration or to place in and out of service redundancy means. However, in general, within the constraints of using only components that are traditionally utilized in fuse technology and the requirement that the process steps also conform to CMOS technology groundrules, no satisfactory solution has been found for making a conventional fuse reprogrammable. Even in those instances, like the ones described by Magel et al or by Lee, the added process steps and the nature of the materials required for its construction, e.g., the anti-fuses, are incompatible with DRAM and microprocessor technology requirements, since such an implementation would be prohibitively expensive.

Practitioners in the art will fully appreciate that there is a need to endow a conventional fuse with the ability of being reprogrammed since such fuses play an important role in the design of circuits and network at a stage when they still undergo changes. This is particularly the case when certain basic operational parameters are not yet defined such as, for instance, clock frequency, loading capacitance, and the like. It would be particularly beneficial to ensure that while a circuit or network is being tested, settings and configurations could be changed at will, preferably by way of reprogramming fuses in order to facilitate the design by introducing a certain amount of flexibility. This is normally not possible with conventional fuse designs.

OBJECT OF THE INVENTION

Accordingly, it is an object of the present invention to provide a fuse which can be programmed repeatedly and which includes at least one fuse link in combination with logic.

It is another object of the present invention to provide a reprogrammable fuse by combining fuse links with exclusive-OR (or exclusive-NOR) logic.

It is a further object of the invention to provide a reprogrammable fuse without requiring extra process steps nor exotic materials and relying solely on those which are commonly used in CMOS technology, particularly in DRAMs, micro-processors, and the like.

It is a still a further object of the invention to use a reprogrammable fuse structure to enable or disable a circuit in the process of being designed to undergo design changes during the life of the circuit.

SUMMARY OF THE INVENTION

To achieve these and other objects, and in view of its purposes, the present invention provides a programmable/reprogrammable fuse circuit that includes fuse links in combination with logic circuits. More particularly, the reprogramming of the fuse link is achieved by exclusive-or gates or exclusive-NOR gates.

In a first aspect of the invention there is provided a programmable/reprogrammable circuit including: two fuse links provided each with at least one terminal port; and an exclusive-or gate connected to the at least one terminal port of each of the two fuse links, wherein the fuse structure is reprogrammed by successively blowing both of the two fuse links.

In a second aspect of the invention there is provided a multi-stage programmable/reprogrammable circuit including: a plurality of fuse links provided each with an output; and a plurality of cascaded exclusive-or gates, wherein a first one of the exclusive-or gates is connected to the output of two fuse links of the plurality of fuse links, and each remaining exclusive-or gate from the plurality of exclusive-or gates has a first input connected to the output of a previous one of the exclusive-or gates and a second input connected to an unused one of the fuse links.

In a third aspect of the invention there is provided a programmable/reprogrammable single row array including: an array of cells arranged in a matrix consisting of a single row and a plurality of columns of the cells; a multi-stage programmable/reprogrammable fuse arrangement controlling the cells positioned along one of the columns of the array; and a multi-stage programmable/reprogrammable fuse arrangement controlling the cells positioned along the row of the array.

BRIEF DESCRIPTION OF THE DRAWINGS

The above-mentioned objects, aspects and advantages of this invention and the manner of attaining them will become more apparent and the invention itself will be better understood by reference to the following description of embodiments of the invention taken in conjunction with the accompanying drawings, the description of which follows.

DETAILED DESCRIPTION OF THE PREFERRED EMBODIMENT

Figure 1:
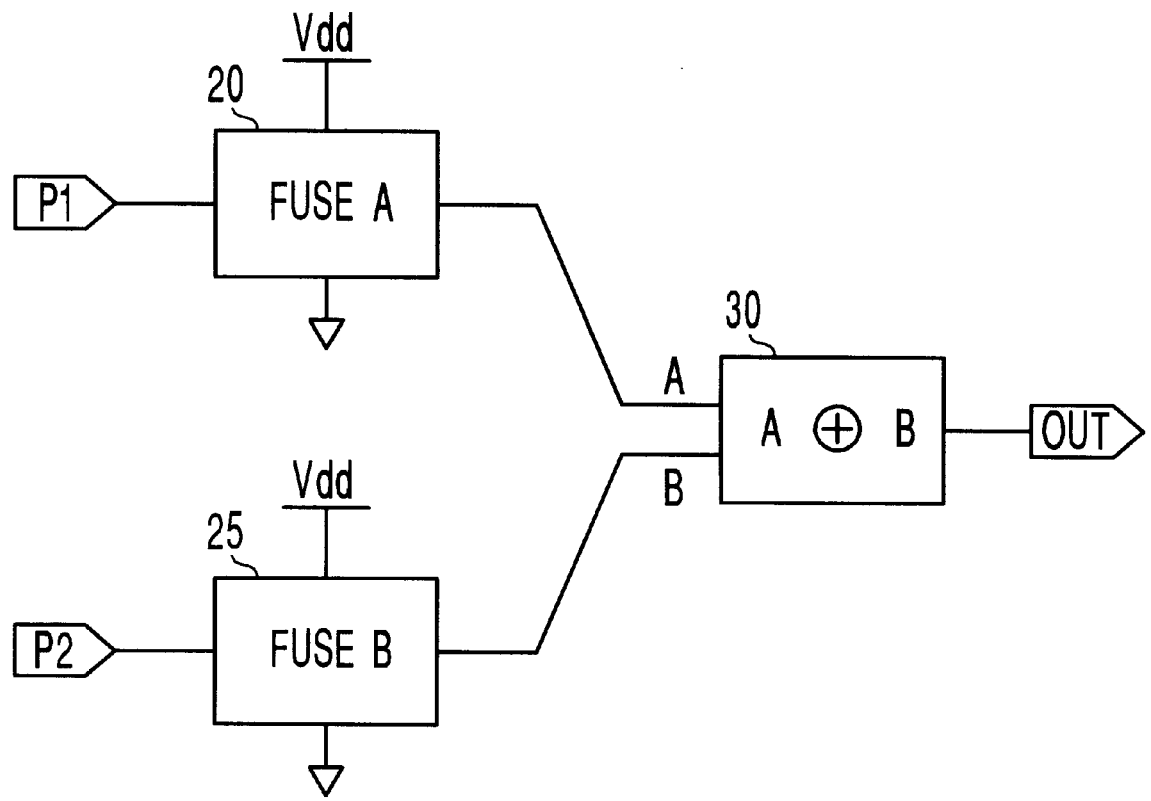
FIG. 1 shows a schematic block diagram of a reprogrammable fuse, in accordance with the present invention.

Referring now to FIG. 1 showing a schematic block diagram of a reprogrammable fuse in accordance with the present invention.

The programming states of the reprogrammable fuse are shown in TABLE I below:

TABLE I

| Fuse A | Fuse B | OUT |
|---|---|---|
| Not-blown | Not-blown | 0 |
| Blown | Not-blown | 1 |
| Blown | Blown | 0 |

Depending whether or not the fuse is blown, the signals at the inputs of fuses A and B are either positive or negative. Each fuse 20 and 25 include a fuse link and associated circuitry, the details of which will be described in more detail with reference to the electrically or laser blown fuses respectively shown in FIGS. 2a and 2b.

Referring back to Table I, in the first step, a logic 0 is applied to inputs P1 and P2, leaving fuses A 20 and B 25 intact. The output of exclusive-or gate (or XOR in short) 30 remains at 0, since both inputs P1 and P2 have the same logic value. In the second step, a logic 1 is applied to either A or B. The output of exclusive-or 30 switches to 1 blowing fuse A 20 and leaving fuse B 25 undamaged. In the third step, a binary 1 is applied to fuse B 25, blowing fuse B and returning the output of XOR 30 to 0.

From a physical design point of view, and still with reference to FIG. 1, both fuses A and B are directly connected to power supply Vdd, which typically ranges from 1 to 5 volts, which is conventionally used in CMOS technology. Exclusive-or circuit 30 is not limited to any particular circuit schematic, type or process as, for instance, in MOS, bipolar or BiCMOS technology. The only determining factor is that the binary value at the output of XOR 30 depend solely on fuses A and B being or not blown. When either fuse is programmed, the output switches to 1, and the output of the XOR does not return to 0 until the second fuse is also programmed. Thus, the sequential reprogramming of the fuse structure allows the output of XOR 30 to switch repeatedly from one polarity to the other.

The fuse structure being described is expandable to include a large plurality of fuses, as will be described hereinafter, allowing the fuse structure to be repeatedly reprogrammed by having the output signal alternatively switching back and forth by way of one fuse being blown at a time. Any individual fuse within the fuse structure, i.e, the combination of fuse links and the XOR gate can only be programmed once, making this operation irrevocable and unrecoverable, as it was explained previously in the Background of the Invention.

Figure 2A:
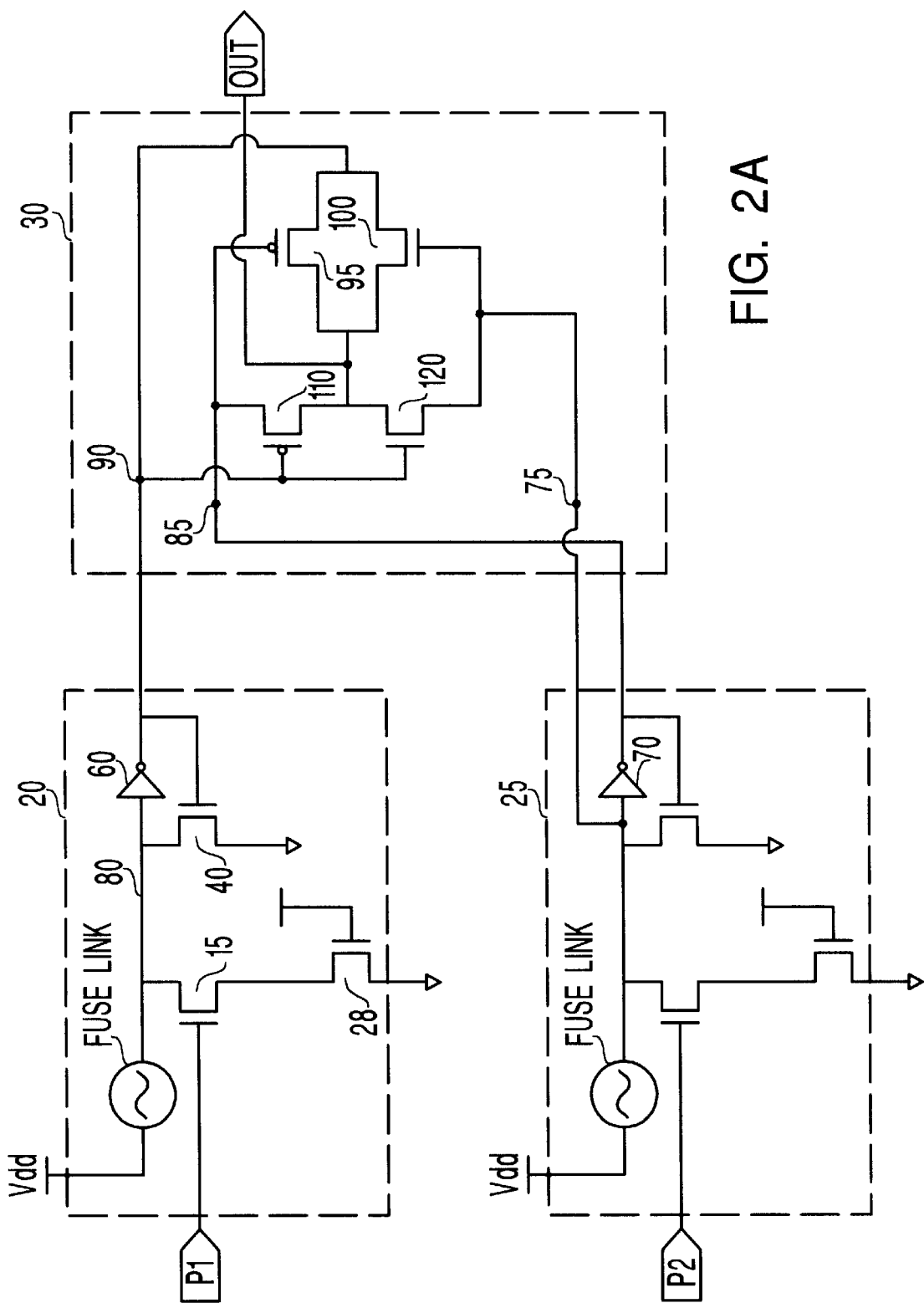
FIG. 2a is a schematic diagram of a detailed electrical circuit forming an electrically blown reprogrammable fuse, according to the invention.

Referring now to FIG. 2a showing a schematic diagram of the electrically blown circuit associated with the programmable fuse, a CMOS representation is depicted to describe the preferred embodiment, although other technologies such as bipolar, BiCMOS and the like could be used with equal success.

Blocks 20 and 25, representing the fuses A and B of FIG. 1, respectively, can be formed using polysilicon, metal, silicide or any other existing fuse material. When, e.g., fuse A is to be blown, a voltage is applied to terminal P1 which electrically programs the fuse. Alternatively, if the fuse link is to be laser 'zapped', a laser beam is aligned with the fuse and the laser energy will blow the fuse, precluding the need that an input terminal be provided. When the voltage is applied to input P1, the gate of NMOS field-effect transistor 15 switches the device to 1. When a voltage is applied to input P1, the gate of the NMOS device 15 switches the transistor on. Concurrently, the device placed underneath, i.e., NMOS device 28 will also turn on, since its gate is directly connected to power supply Vdd. When this occurs, a path to ground is created, and a large current will flow from Vdd to ground. The fuse blows once the current density reaches a certain threshold, i.e., 70 ma/$\mu m^2$ of polysilicon, typically for a cross-section ¼ $\mu$m wide and ½ $\mu$m high, or alternatively, once the current reaches a value between 10–15 ma, for disconnecting a path to Vdd.

Node 80 is shown connected to ground through NMOS transistors 15 and 28, and subsequently through transistor NMOS 40, (hereinafter referred to as a 'keeper transistor', namely, a device that latches a logic value at a given node, in this instance, node 80). The purpose of using keeper transistor is to remove the voltage that is applied to input P1 and save power once the fuse has been blown. Node 90 turns keeper device NMOS 40 on, such that node 80 is maintained at 0 even when the path through NMOS 15 and 28 shuts off. As long as fuse A is remains intact, node 80 stays at 1, since a path to power supply Vdd through the fuse remains unimpaired. The output of inverter 60 remains at 0, shutting-off keeper device NMOS 40. A logic 1 at node 80 inhibits the device from leaking.

Fuse B operates in an identical manner, except that both true and complementary signals 75 and 85, respectively originating from the input and output of inverter 70, feed XOR circuit 30. Practitioners in the art will appreciate that the exclusive-or circuit depicted by block 30 is by no means unique, and that other equivalent CMOS circuits, such as an exclusive-NOR, may be used just as effectively.

Referring now to XOR circuit 30, the signal outputted from inverter 60 is fed to the input of the inverter consisting of PMOS 110 and NMOS 120. The same signal is also fed to the input of a transfer gate consisting of PMOS 95 and NMOS 100. As previously mentioned, the complementary signal 75 from fuse B is fed to the gate of NMOS 100 of the transfer gate, as well as to the source of NMOS inverter 120. The true signal, also generated by fuse B 25, is fed to the gate of the PMOS 95 transfer gate and to the source of PMOS 110 of the inverter comprised of PMOS 110 and NMOS 120. This arrangement enables XOR 30 to operate in the manner described with reference to TABLE I shown above. The fact that FIG. 1 shows only one input being outputted from each fuse A and B may be attributed to the fact that certain XOR circuits do not always generate true and complementary signals. The preferred embodiment shown in FIG. 2a has the distinct advantage over the circuit schematically shown in FIG. 1 in its improved speed.

Figure 2B:
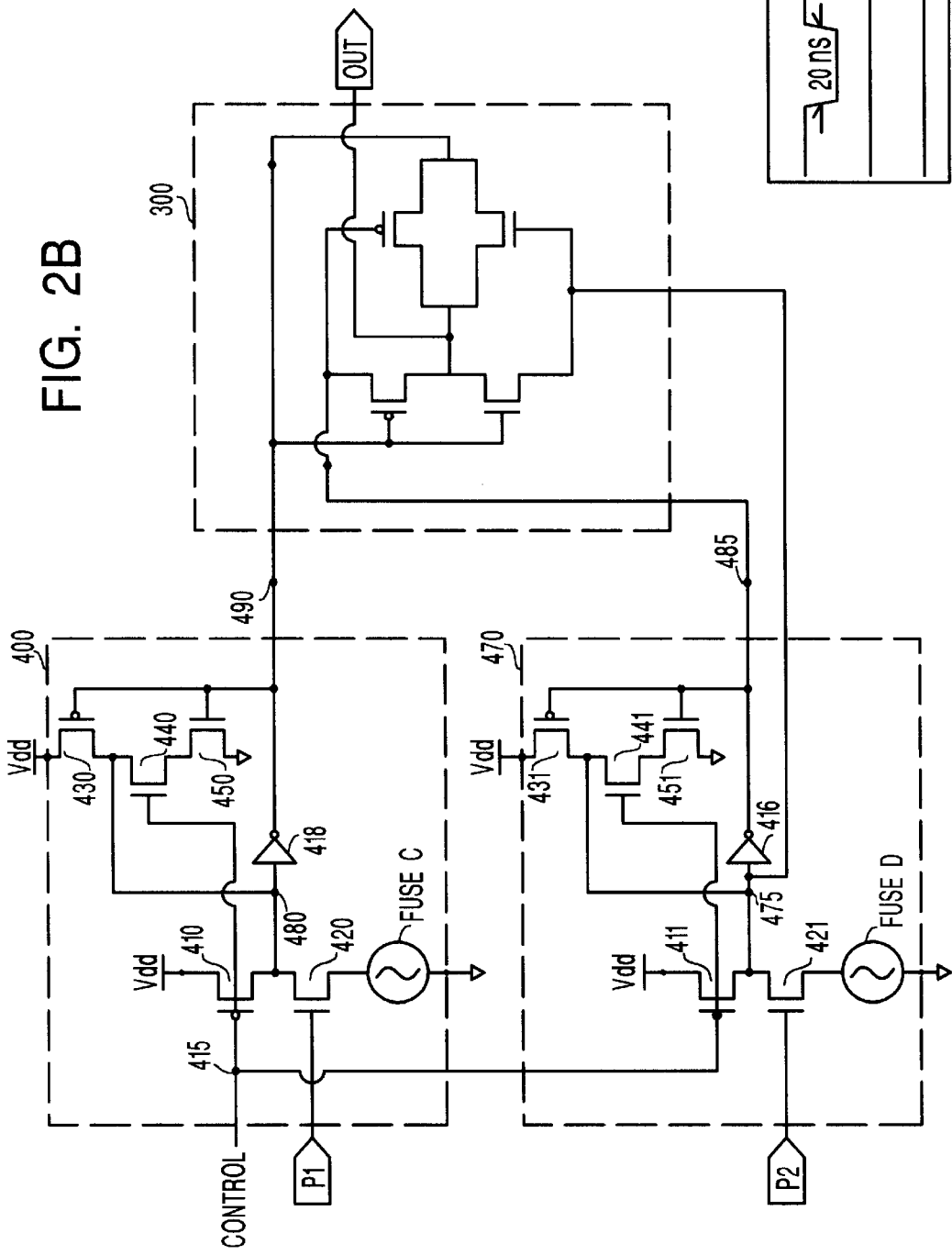
FIG. 2b is a schematic diagram of a detailed electrical circuit forming a laser blown reprogrammable fuse, according to the invention.

Shown in FIG. 2b is an example of a fuse which is blown by a laser beam in lieu of an electrical impulse. Two fuses 400 and 470 are shown connected to an XOR gate 300. A control pin 415 activates fuses 400 and 470, although such a pin is not required by an electrically blown fuse. Control pin 415 is connected to the PMOS gates of each fuse 410 and 411. The sources of 410 and 411 are attached to the supply voltage Vdd and the drain to NMOS 420 and 421, respectively. The gate of NMOS 420 is connected to input pin P1, while the gate of NMOS 421 is attached to input pin P2, both of which are used to program a 'fuse latch' which will be explained hereinafter.

Figure 2C:
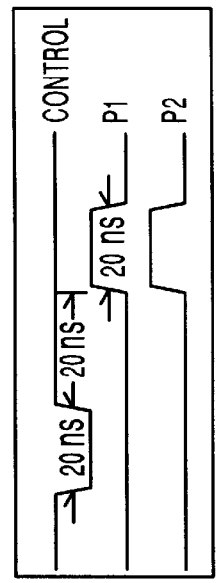
FIG. 2c is a timing diagram showing the waveforms of signals which activate the circuit illustrated in FIG. 2b.

Details of a timing diagram is shown in FIG. 2C, illustrating the waveforms signals of P1 and P2 that activate the circuit shown in FIG. 2b. To better understand the programming of the fuses, FIGS. 2b and 2c should be read concurrently.

First, control pin 415 switches to 0 to condition internal nodes 480 and 481, respectively, setting them to 1. Since P1 and P2 are kept at 0, no leakage occurs between Vdd and ground. Two conditions exist to program the laser blown fuse. Let it be assumed that the fuse element C in block 400 has not yet been blown. While this condition persists, the source of NMOS 420 remains connected to ground. Preconditioning the circuits requires approximately 20 ns. Then, following an additional 20 ns after preconditioning, all "program" (input) pins, such as P1 and P2, are set to 1 for approximately 20 ns. As long as fuse C is not programmed, the state of internal node 480 will switch from 1 to 0 by way of NMOS 420. The latch formed by inverter 418, and the three devices NMOS 440, NMOS 450 and PMOS 430, will invert the internal node 480 and store data at node 490.

Accordingly, for a fuse which has not been blown, the latched data at node 490 remains at 1. Now, after the fuse is programmed, data at node 490 switches to 0, since the link between internal node 480 and ground through NMOS 420 is severed. The operation of fuse element 470 is identical to that applicable to fuse block 400. The operation of the combination of two fuses with an XOR gate is similar to that described with reference to FIG. 2a.

Figure 3:
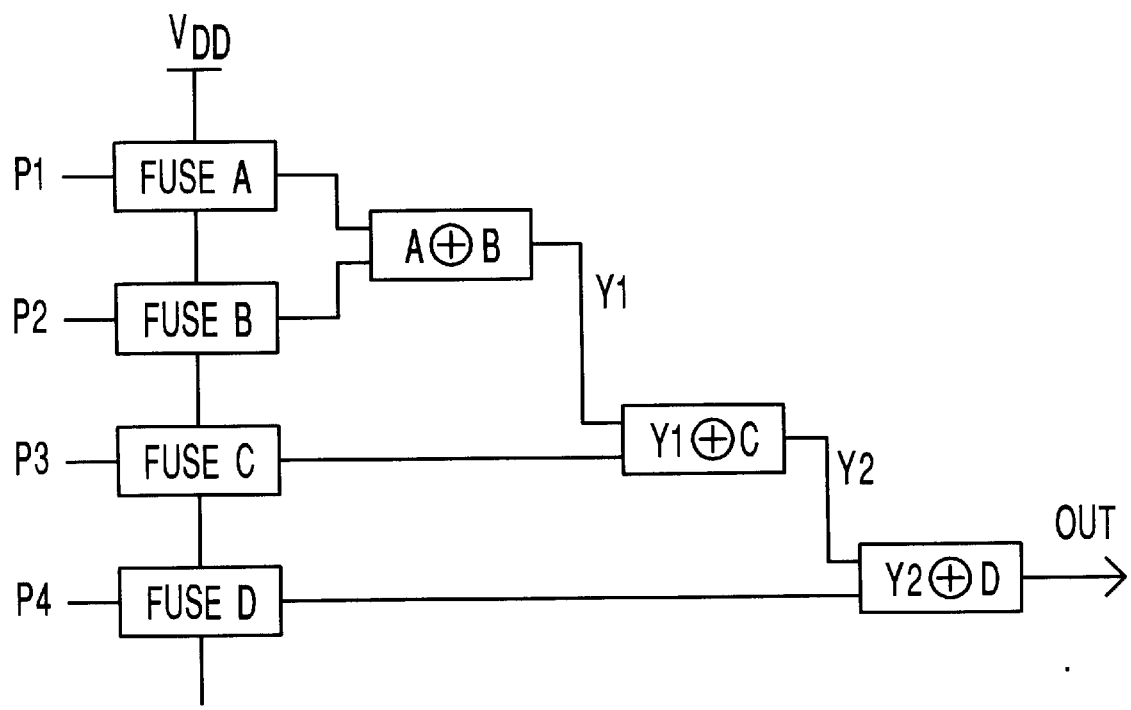
FIG. 3 depicts a schematic block diagram of a multi-stage reprogrammable fuse logic, according to the invention.

Referring now to FIG. 3, a multi-stage reprogrammable fuse consisting of a plurality of logic stages is shown with four fuses A, B, C, and D, respectively having inputs P1, P2, P3 and P4. The first two fuses, i.e., A and B, are connected to each other by way of an exclusive-OR circuit described previously with reference to FIG. 1. Output Y1 of exclusive-or circuit A⊕B provides a first input to the exclusive-OR circuit Y1⊕C. The second input is provided by fuse C. In a similar manner, the next stage is provided with an exclusive-OR gating fuse D to the output Y2 of the previous stage.

The multi-stage reprogrammable fuse operates as follows. Each fuse A, B, C and D is electrically programmed by way of inputs A, B, C, and D, in the same manner previously described with reference to fuses A and B. Alternatively, the fuses can be laser blown, obviating the need for the inputs terminals. The structure shown in FIG. 3 can be reprogrammed a total of four times before exhausting all the possibilities. Practitioners of the art will fully realize that other similar logic combinations can be used in lieu of the one illustrated in FIG. 3, particularly by replacing the sequential organization of exclusive-ORs with a parallel organization.

Figure 4:
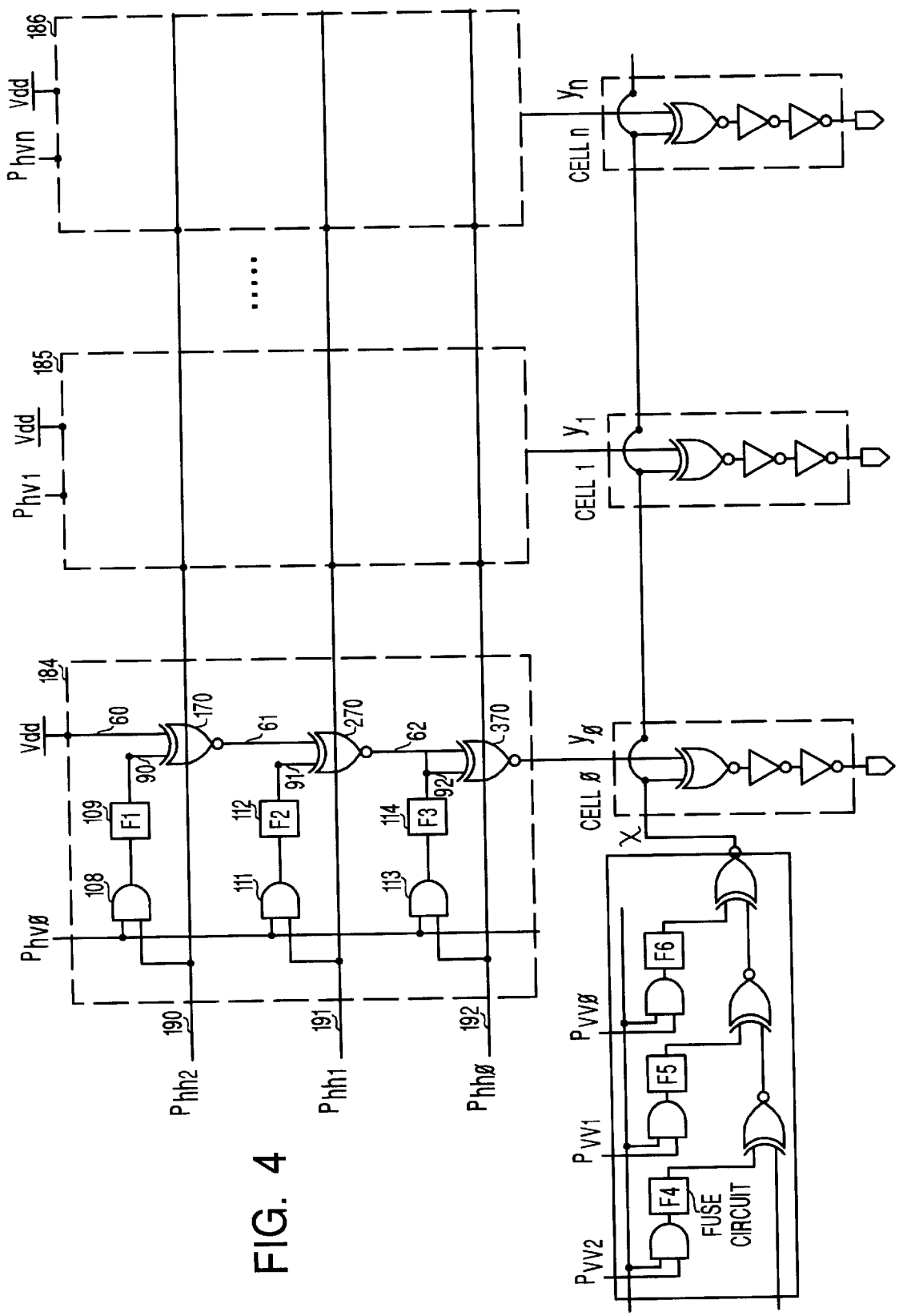
FIG. 4 is a schematic diagram of a detailed electrical circuit that includes a plurality of reprogrammable fuses in accordance with the present invention.

Referring now to FIG. 4, there is shown a circuit that illustrates the use of the arrangement shown in FIG. 3. The circuit to be described has wide application as a programmable security code circuit, wherein a predetermined security code is inputted by blowing the fuses on selected cells. The code pattern thus entered can be read, but once the code has been set into the circuitry, it can no longer be erased nor reprogrammed. In accordance with the principles of the invention, the fuses can now be reprogrammed as often as desired allowing for the multiple reuse of the same circuit.

The programmable fuse circuit of FIG. 4 is set and reset in the following manner: Phh2, Phh1, and Phh0 are the horizontal fuse addresses for the columns, while Phv0, Phv1, and Phvn are the vertical fuse addresses for the columns. For simplicity sake, only one row and n columns are shown. Thus, the address of the fuse for the row in the horizontal direction is Phv0, while Pvv0 Pvv1 and Pvv2 are the corresponding ones in the vertical direction. In the first column of the array (associated with cell 0) three programmable fuses of the type described previously are shown including AND gates 108, 111, and 113, respectively driving fuses 109, 112 and 114. Each of the AND gates is controlled by horizontal fuse addresses Phh2 Phh1, and Phh0 on a first input of the AND gate, and by Phv0, the vertical fuse addresses for the columns. The same arrangement applies to the second column, with a like fuse arrangement controlled by the same horizontal addresses and by Phv1, as its vertical fuse address. Similar circuit configurations are extended to each column forming the array of cells. On the single row, control line X is the output of the same arrangement described for the column forming the programmable circuit. Its vertical address lines are provided by Pvv2, Pvv1 and Pvv0, while the horizontal address line is provided Pvh0. Jointly they control the same AND gate/fuse combination previously described.

In accordance with the description of previous circuit arrangement, there will be three programming opportunities for each individual cell. By way of example, if the horizontal address is maintained unchanged, cell0 can be programmed a total of four times using Phv0 and the horizontal fuse addresses Phh0, Phh1 and Phh2.

When all fuses are in their initial undamaged state, line a0 is at 0 and b0 at 1. Thus, the output b1 of XOR 170 is at 1 and the output y0 of the last XOR of the chain, i.e., XOR 370, will remain at a logic 1 and will stay at that level for as long as all the fuses of that column are not programmed.

Figure 5C:
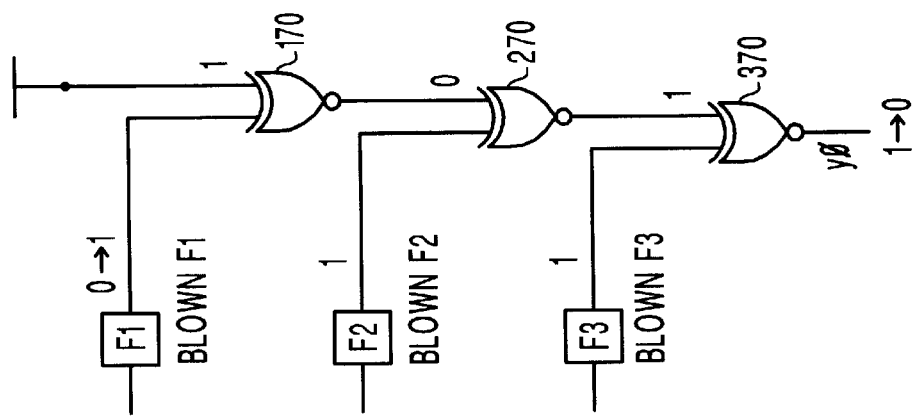
FIGS. 5a–5c shows a typical programming sequencing applicable to a three-way reprogrammable fuse when the fuses are successively blown.
Figure 5B:
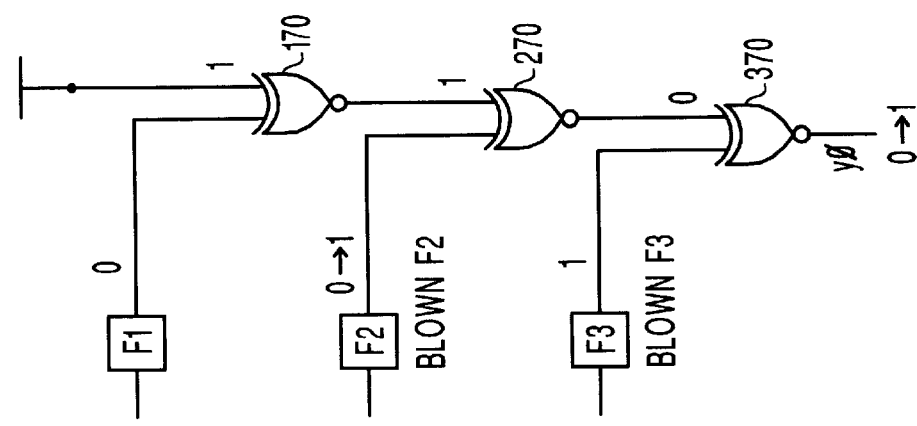
Figure 5A:
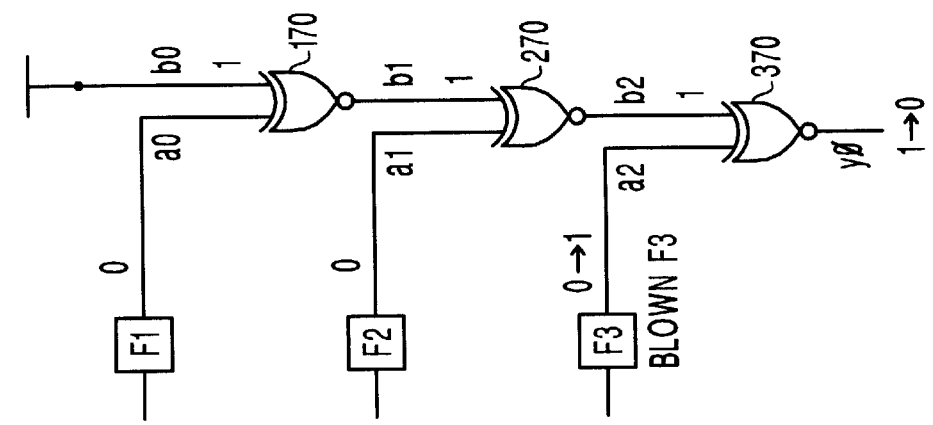

Referring now to FIG. 5*a*, showing an illustrative scheme for programming a cell (e.g., cell0 or cell1 of FIG. 4), let it be assumed that initially fuse F3 is to be programmed. Then, the output of XOR gate 370 switches from 1 to 0. In FIG. 5*b*, when fuse F2 is blown (in addition to the previously programmed fuse F3), the output of XOR gate 270 switches from a low to a high. When taken concurrently with the programmed output from fuse F3, the output of XOR gate 370 now switches back from 0 to a 1. Finally, referring to FIG. 5*c*, when fuse F1 is blown (in addition to the previously programmed fuses F3 and F2), the output of XOR gate 170 switches from 1 to 0, the output of XOR gate 270 from 0 to 1, and the output of XOR gate 370 switches from 1 back to 0. The sequence of fuse blowing is irrelevant, as long as at each occurrence only one fuse is blown at a time, forcing the output of the final stage XOR to change state.

When all the cells in a row are programmed, three individual programming opportunities exist to change the polarity of the cells on the selected row. For instance, referring to FIG. 4, fuses F4, F5 and F6 are sequentially programmed using Pvh0 ANDed with vertical addresses Pvv0, Pvv1, and Pvv2. The programming used in this instance is identical to that described with respect to the horizontal fuse programming mentioned previously.

Figure 6:
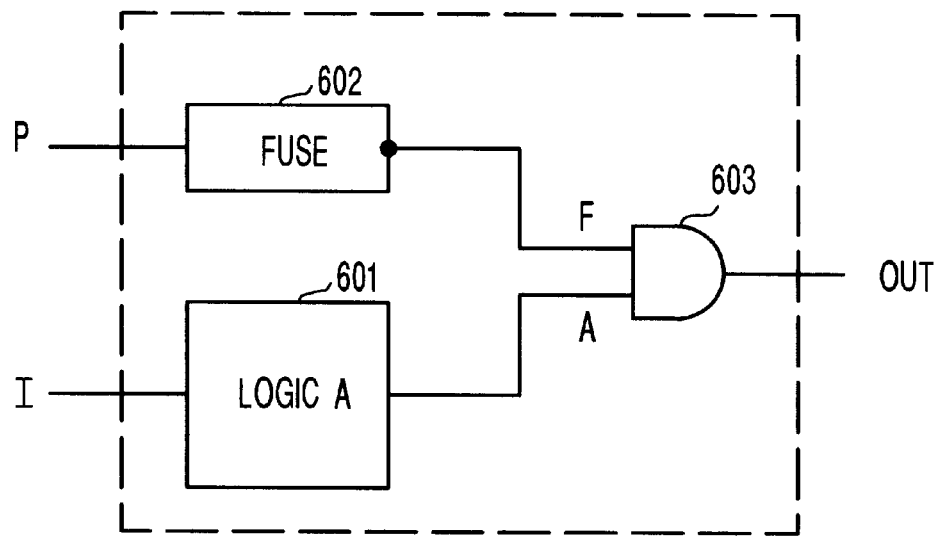
FIG. 6 shows a schematic block diagram of a reprogrammable fuse for toggling the output of a logic block to ground or to the normal state of the logic.

Referring now to FIG. 6, a logic (or memory) 601 having a plurality of inputs I1, I2, . . . , In (shown for simplicity sake as input I) is depicted in conjunction with a reprogrammable fuse block 602 corresponding to that shown in FIG. 4 and having inputs 602, i.e, P1, P2, . . . , Pn (collectively shown as P). The outputs of 601 and 602 are connected to an AND gate 603 having an output OUT. Individual fuses within the reprogrammable fuse block 602 can now be blown one at time allowing OUT to alternatively toggle between the logic state of 601 and ground, as shown in TABLE II below:

TABLE II

| Input I | Input P | OUT |
|---|---|---|
| Don't care | F1 | 0 |
| Don't care | F2 | A |
| Don't care | F3 | 0 |
| Don't care | F4 | A |

Figure 7:
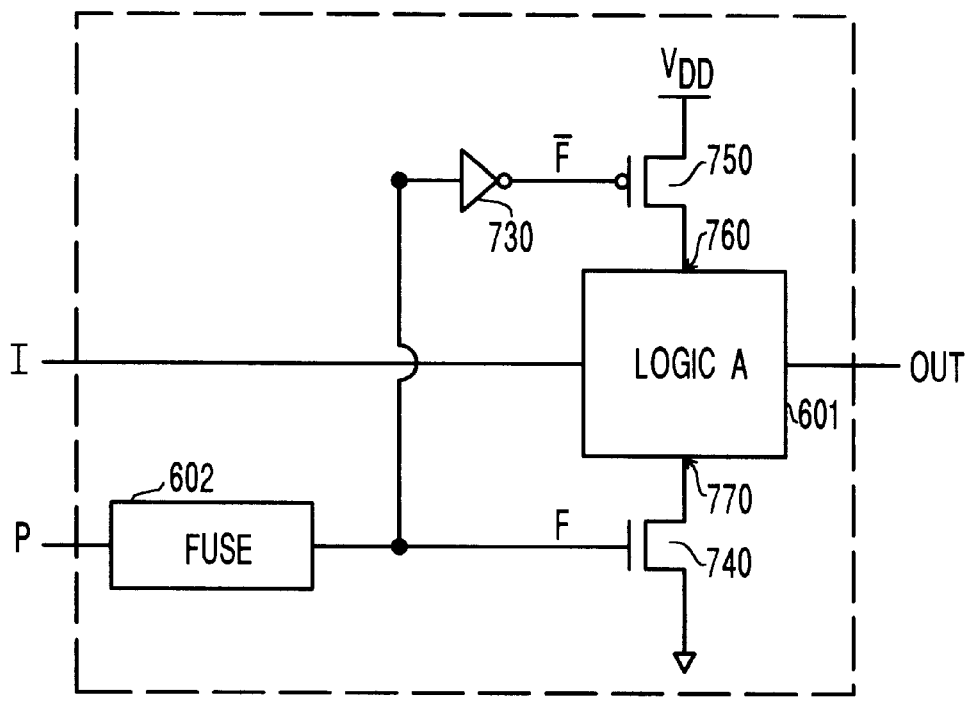
FIG. 7 shows a schematic block diagram of a reprogrammable fuse for toggling the output of logic block to ground or to a tri-state (high-impedance) state.

Referring now to FIG. 7, there is shown a schematic block diagram of a reprogrammable fuse for toggling the output of logic block between its normal state and its high-impedance state (also referred to as tri-state). Logic A (or memory) block 601 is depicted having its power supply node 760 connected to the drain of a PMOS device 750 and its ground node 770 to the drain of an NMOS device 740. The source of PMOS 750 is connected to the power supply Vdd, while the source of NMOS 740 is attached to ground. Fuse block 602 has its output F connected to the gate of NMOS device 740, and by way of an inverter 730, to the gate of PMOS device 750. By alternatively switching back and forth the fuse output, it is possible to toggle the output of block 601. When block 601 is disconnected, its output remains in a high-impedance mode, as shown below with reference to TABLE III.

TABLE III

| Input I | Input P | OUT |
|---|---|---|
| Don't care | F1 | High impedance |
| Don't care | F2 | Normal |
| Don't care | F3 | High impedance |
| Don't care | F4 | Normal |

Figure 8:
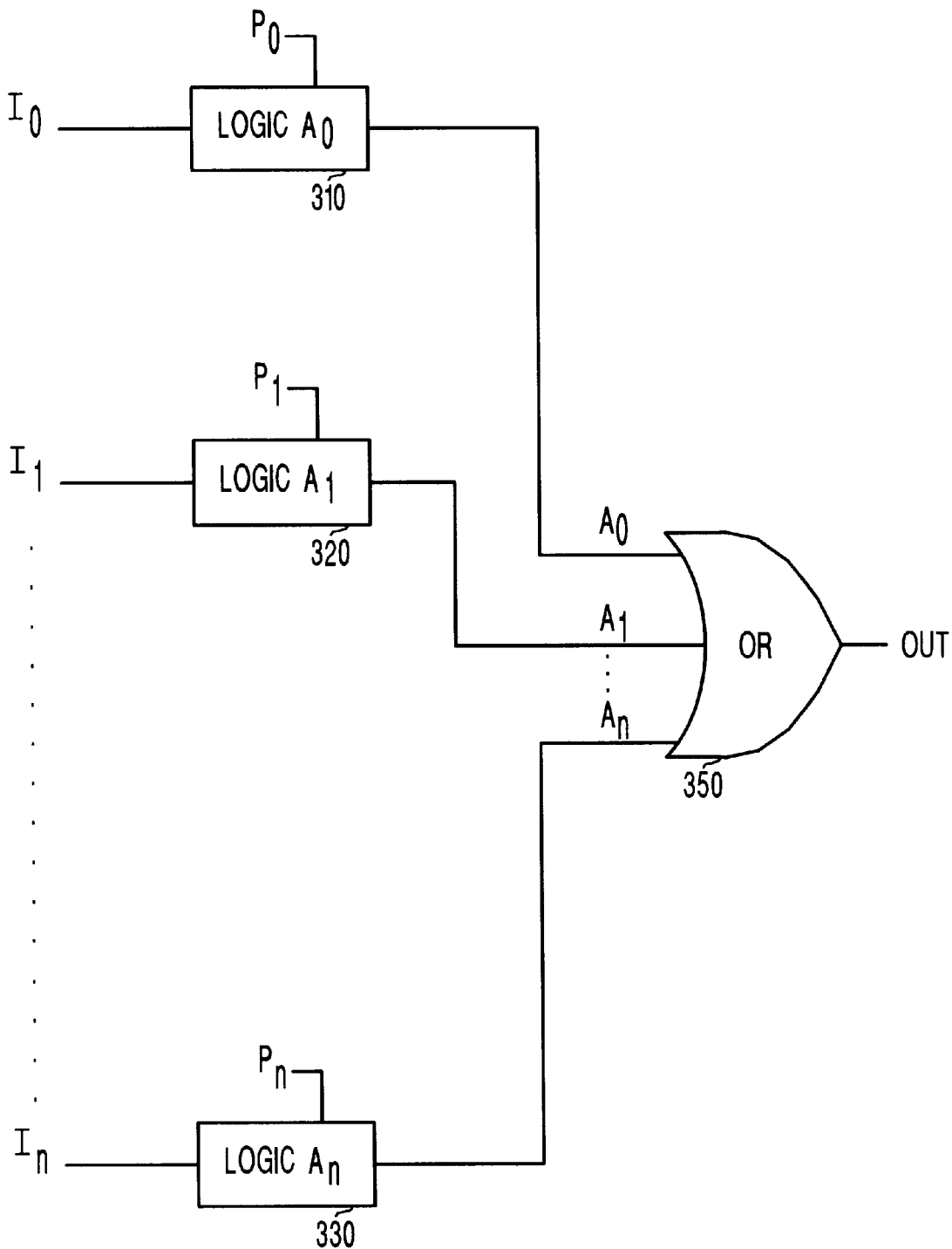
FIG. 8 is a schematic block diagram of a reprogrammable fuse for selecting and deselecting a plurality of logic circuits which are individually programmed.

Referring now to FIG. 8, there is shown a schematic block diagram of a reprogrammable fuse for selecting and deselecting a plurality of logic circuits which are individually programmed.

Either circuit configuration shown in FIG. 7 or FIG. 8 can be used to select or deselect each logic sub-circuit block to the output OUT. Logic blocks 310, 320, . . . , 330 are similar to the circuits shown in FIGS. 1 and 2. P0, P1, . . . , Pn are the programming pins for each circuit block to select or deselect any given block from the OR gate 350, and I1, . . . , In are the inputs to each logic block. More than one input per block is usually present, although for illustrative purposes only one is shown. By judiciously programming a fuse element of each sub-circuit block, one may selectively remove or add any sub-circuit block to the output OUT of the OR gate 350. Reprogramming can be extended until all the fuse elements are programmed.

The circuit shown in FIG. 8 can be used in a wide variety of applications, particularly in redundancy replacement schemes for memory devices. Even after selecting a redundancy unit, one may still have the option of disconnecting the selected redundancy unit and replace it with another. This is of particular importance for defects appearing later during the life cycle of the product.

While this invention has been described with reference to a preferred embodiment, various modifications known to those skilled in the art, such as using exclusive-NOR circuits may be made to the structure presented herein without departing from the invention as recited in the several claims appended thereto.

What is claimed is:

1. A reprogrammable fuse arrangement comprising:
   two fuse links provided each with at least one terminal port; and
   an exclusive-or gate having inputs, each of said inputs is solely connected to said at least one terminal port of each of said two fuse links, wherein said fuse arrangement can be repeatedly programmed by successively blowing said two fuse links.

2. The reprogrammable fuse arrangement recited in claim 1, wherein each of said two fuses links has an input port, said input port being provided with electrical means for programming said fuse links.

3. The reprogrammable fuse arrangement recited in claim 2, wherein said electrical means is a voltage or a current.

4. The reprogrammable fuse arrangement recited in claim 1, wherein said programming of said fuse arrangement is provided by blowing said fuse links with a laser beam.

5. The reprogrammable fuse arrangement recited in claim 1, wherein said exclusive-or gate is replaced with an exclusive-NOR gate.

6. A multi-stage reprogrammable fuse arrangement comprising:
   a plurality of fuse links provided each with an output; and
   a plurality of cascaded exclusive-or gates, wherein a first one of said exclusive-or gates is connected solely to the output of two fuse links of said plurality of fuse links, and each remaining exclusive-or gate has a first input solely connected to the output of a previous one of said exclusive-or gates and a second input connected solely to an unused one of said plurality of fuse links, wherein said multi-stage reprogrammable fuse arrangement can be repeatedly programmed by successively blowing said plurality of fuse links.

7. The multi-stage reprogrammable fuse arrangement as recited in claim 6, wherein each of said outputs of said plurality of fuse links is programmed by sequentially switching a corresponding input of each one of said fuse links to a logic 1.

8. The multi-stage reprogrammable fuse arrangement as recited in claim 6, wherein each of said fuse links is sequentially blown by a laser beam.

9. The multi-stage reprogrammable fuse arrangement recited in claim 6, wherein said exclusive-or gate is replaced with an exclusive-NOR gate.

10. A reprogrammable single row array comprising:
    an array of cells arranged in a matrix consisting of a single row and a plurality of columns of said cells;
    a multi-stage reprogrammable fuse arrangement controlling said cells positioned along one of said columns of said array of cells; and
    a multi-stage reprogrammable fuse arrangement controlling said cells positioned along said single row of said array of cells.

11. The reprogrammable single row array recited in claim 10, wherein each cell is further controlled by at least one exclusive-or gate.

12. The reprogrammable single row array recited in claim 10, wherein each cell is further controlled by at least one exclusive-NOR gate.

13. The reprogrammable single row array recited in claim 10 wherein multi-stage reprogrammable fuse arrangement further comprises:
    a plurality of fuses provided each with an output; and
    a plurality of cascaded exclusive-or gates, wherein a first one of said exclusive-or gates is connected to the output of two fuses of said plurality of fuses, and each remaining exclusive-or gate from said plurality of exclusive-or gates has a first input connected to the output of a previous one of said exclusive-or gates and a second input connected to an unused one of said fuses comprising said plurality of fuses.

14. The reprogrammable single row array recited in claim 13 wherein selected ones of said fuses are blown by a laser.

15. A reprogrammable logic or memory arrangement comprising:
    a reprogrammable fuse arrangement comprising:
       a plurality of fuse links provided each with an output; and
       a plurality of cascaded exclusive-or gates, wherein a first one of said exclusive-or gates is connected to the output of two fuse links of said plurality of fuse links, and each remaining exclusive-or gate from said plurality of exclusive-or gates has a first input connected to the output of a previous one of said exclusive-or gates and a second input connected to an unused one of said plurality of fuse links;
    a logic or memory block having a plurality of inputs and one output; and
    a switching gate provided with two inputs, one of said inputs being connected to said output of said logic or memory block, and the second input of said switching gate being connected to the last output of said exclusive-or gate of said reprogrammable fuse arrangement.

16. The reprogrammable logic or memory arrangement recited in claim 15 wherein the output of said logic or memory block alternatively switches between a logic state of said logic or memory block and a logic 0.

17. A reprogrammable logic or memory arrangement comprising:
    a reprogrammable fuse arrangement comprising:
       a plurality of fuse links provided each with an output; and
       a plurality of cascaded exclusive-or gates, wherein a first one of said exclusive-or gates is connected to the output of two fuse links of said plurality of fuse links, and each remaining exclusive-or gate from said plurality of exclusive-or gates has a first input connected to the output of a previous one of said exclusive-or gates and a second input connected to an unused one of said plurality of fuse links;
    a logic or memory block having a plurality of inputs and one output; and
    a plurality of switching gates coupled to said reprogrammable fuse arrangement and to said logic or memory block, wherein the output of said logic or memory block alternatively switches between a normal state of said logic or memory block and a high-impedance logic state.

18. A reprogrammable system comprising:
    a plurality of logic or memory blocks;
    a plurality of reprogrammable fuse arrangements, each of said reprogrammable fuse arrangements being connected to one of said logic or memory blocks;
    an OR-gate having inputs connected to the output of each of said logic or memory blocks, wherein said reprogrammable fuse arrangements select and deselect any one of said plurality of logic or memory blocks.

19. A method for reprogramming a fuse arrangement comprising the steps of:
    providing two fuse links, each link having at least one terminal port;

providing an exclusive-or gate connected to said at least one terminal port of each of said two fuse links; and successively blowing both of said two fuse links.

20. The method as recited in claim 19, wherein each of said two fuses links has an input port, said input port being provided with electrical means for programming said fuse links.

21. The method as recited in claim 19, wherein said electrical means is a voltage or a current.

22. The method as recited in claim 19, wherein said programming of said fuse arrangement is provided by blowing said fuse links with a laser beam.

23. A method of reprogramming a multi-stage fuse arrangement comprising the steps of:

providing a plurality of fuse links provided each with an output;

providing a plurality of cascaded exclusive-or gates, wherein a first one of said exclusive-or gates is connected to the output of two fuse links of said plurality of fuse links, and each remaining exclusive-or gate from said plurality of exclusive-or gates has a first input connected to the output of a previous one of said exclusive-or gates and a second input connected to an unused one of said fuse links; and successively blowing said plurality of fuse links.

* * * * *